United States Patent
Su et al.

(10) Patent No.: US 9,165,900 B2
(45) Date of Patent: Oct. 20, 2015

(54) SEMICONDUCTOR PACKAGE AND PROCESS FOR FABRICATING SAME

(71) Applicant: Advanced Semiconductor Engineering, Inc., Kaohsiung (TW)

(72) Inventors: Yuan-Chang Su, Luzhu Township (TW); Shih-Fu Huang, Zhudong Township (TW); Chia-Cheng Chen, Zhongli (TW); Chia-Hsiung Hsieh, Yanshui Township (TW); Tzu-Hui Chen, Taitung (TW); Kuang-Hsiung Chen, Taoyuan (TW); Pao-Ming Hsieh, Zhubei (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 14/174,364

(22) Filed: Feb. 6, 2014

(65) Prior Publication Data
US 2014/0151876 A1   Jun. 5, 2014

Related U.S. Application Data

(63) Continuation of application No. 12/904,799, filed on Oct. 14, 2010, now Pat. No. 8,786,062.

(60) Provisional application No. 61/251,396, filed on Oct. 14, 2009, provisional application No. 61/294,519, filed on Jan. 13, 2010.

(30) Foreign Application Priority Data

Mar. 15, 2010  (TW) .............................. 99107472 A

(51) Int. Cl.
*H01L 23/00* (2006.01)
*H01L 21/683* (2006.01)
(Continued)

(52) U.S. Cl.
CPC ............ *H01L 24/14* (2013.01); *H01L 21/6835* (2013.01); *H01L 23/3128* (2013.01);
(Continued)

(58) Field of Classification Search
None
See application file for complete search history.

(56) References Cited

U.S. PATENT DOCUMENTS 5,583,376 A   12/1996   Sickler et al.
5,592,025 A    1/1997   Clark et al.
(Continued)

FOREIGN PATENT DOCUMENTS

TW           200924137           6/2009

OTHER PUBLICATIONS

Appelt et al., "Coreless substrates status." Proc. EPTC 2010 (12th Electronics Packaging Tech. Conf, Singapore (2010).
(Continued)

*Primary Examiner* — Fernando L Toledo
*Assistant Examiner* — Valerie N Newton
(74) *Attorney, Agent, or Firm* — Foley & Lardner LLP; Cliff Z. Liu; Angela D. Murch

(57) ABSTRACT

A package carrier includes: (a) a dielectric layer defining a plurality of openings; (b) a patterned electrically conductive layer, embedded in the dielectric layer and disposed adjacent to a first surface of the dielectric layer; (c) a plurality of electrically conductive posts, disposed in respective ones of the openings, wherein the openings extend between a second surface of the dielectric layer to the patterned electrically conductive layer, the electrically conductive posts are connected to the patterned electrically conductive layer, and an end of each of the electrically conductive posts has a curved profile and is faced away from the patterned electrically conductive layer; and (d) a patterned solder resist layer, disposed adjacent to the first surface of the dielectric layer and exposing portions of the patterned electrically conductive layer corresponding to contact pads. A semiconductor package includes the package carrier, a chip, and an encapsulant covering the chip and the package carrier.

20 Claims, 25 Drawing Sheets

(51) Int. Cl.
  *H01L 23/31* (2006.01)
  *H01L 23/498* (2006.01)
  *H05K 1/11* (2006.01)

(52) U.S. Cl.
  CPC .... *H01L23/49816* (2013.01); *H01L 23/49827* (2013.01); *H01L 24/32* (2013.01); *H01L 24/48* (2013.01); *H05K 1/111* (2013.01); *H01L 24/29* (2013.01); *H01L 2221/68345* (2013.01); *H01L 2224/27013* (2013.01); *H01L 2224/32188* (2013.01); *H01L 2224/32225* (2013.01); *H01L 2224/484* (2013.01); *H01L 2224/48091* (2013.01); *H01L 2224/48227* (2013.01); *H01L 2224/48228* (2013.01); *H01L 2224/73265* (2013.01); *H01L 2224/83051* (2013.01); *H01L 2924/014* (2013.01); *H01L 2924/0105* (2013.01); *H01L 2924/01005* (2013.01); *H01L 2924/01028* (2013.01); *H01L 2924/01029* (2013.01); *H01L 2924/01033* (2013.01); *H01L 2924/01046* (2013.01); *H01L 2924/01047* (2013.01); *H01L 2924/01075* (2013.01); *H01L 2924/01078* (2013.01); *H01L 2924/01079* (2013.01); *H01L 2924/01082* (2013.01); *H01L 2924/078* (2013.01); *H01L 2924/15311* (2013.01)

(56) References Cited

U.S. PATENT DOCUMENTS

| | | |
|---|---|---|
| 5,874,784 A | 2/1999 | Aoki et al. |
| 5,994,773 A | 11/1999 | Hirakawa |
| 6,060,775 A | 5/2000 | Ano |
| 6,080,932 A | 6/2000 | Smith et al. |
| 6,087,717 A | 7/2000 | Ano et al. |
| 6,177,636 B1 | 1/2001 | Fjelstad |
| 6,198,165 B1 | 3/2001 | Yamaji et al. |
| 6,232,650 B1 | 5/2001 | Fujisawa et al. |
| 6,232,661 B1 | 5/2001 | Amagai et al. |
| 6,242,815 B1 | 6/2001 | Hsu et al. |
| 6,271,057 B1 | 8/2001 | Lee et al. |
| 6,331,451 B1 | 12/2001 | Fusaro et al. |
| 6,358,780 B1 | 3/2002 | Smith et al. |
| 6,552,430 B1 | 4/2003 | Perez et al. |
| 6,580,159 B1 | 6/2003 | Fusaro et al. |
| 6,663,946 B2 | 12/2003 | Seri et al. |
| 6,774,317 B2 | 8/2004 | Fjelstad |
| 6,861,757 B2 | 3/2005 | Shimoto et al. |
| 6,969,916 B2 | 11/2005 | Shizuno |
| 6,977,348 B2 | 12/2005 | Ho et al. |
| 7,319,049 B2 | 1/2008 | Oi et al. |
| 7,338,884 B2 | 3/2008 | Shimoto et al. |
| 7,405,486 B2 | 7/2008 | Kato |
| 7,423,340 B2 | 9/2008 | Huang et al. |
| 7,566,969 B2 | 7/2009 | Shimanuki |
| 7,595,553 B2 | 9/2009 | Nagamatsu et al. |
| 7,598,616 B2 * | 10/2009 | Yang et al. .................. 257/774 |
| 7,612,295 B2 | 11/2009 | Takada et al. |
| 7,842,541 B1 | 11/2010 | Rusli et al. |
| 7,902,648 B2 | 3/2011 | Lee et al. |
| 7,948,090 B2 | 5/2011 | Manepalli et al. |
| 8,288,869 B2 | 10/2012 | Huang et al. |
| 8,330,267 B2 | 12/2012 | Chen et al. |
| 8,334,594 B2 | 12/2012 | Lo et al. |
| 8,367,473 B2 | 2/2013 | Huang et al. |
| 8,399,776 B2 | 3/2013 | Appelt et al. |
| 8,569,894 B2 | 10/2013 | Su et al. |
| 2002/0030266 A1 | 3/2002 | Murata |
| 2002/0056192 A1 | 5/2002 | Suwa et al. |
| 2002/0153618 A1 | 10/2002 | Hirano et al. |
| 2002/0171145 A1 | 11/2002 | Higuchi et al. |
| 2002/0173069 A1 | 11/2002 | Shibata |
| 2002/0182776 A1 | 12/2002 | Fujisawa et al. |
| 2002/0192872 A1 | 12/2002 | Fujisawa et al. |
| 2003/0030137 A1 | 2/2003 | Hashimoto |
| 2003/0034553 A1 | 2/2003 | Ano |
| 2003/0098502 A1 | 5/2003 | Sota |
| 2003/0213990 A1 | 11/2003 | Tsai et al. |
| 2004/0080054 A1 | 4/2004 | Chinda et al. |
| 2004/0110319 A1 | 6/2004 | Fukutomi et al. |
| 2004/0201101 A1 | 10/2004 | Kang et al. |
| 2005/0006752 A1 | 1/2005 | Ogawa |
| 2005/0186704 A1 | 8/2005 | Yee et al. |
| 2007/0052076 A1 | 3/2007 | Ramos et al. |
| 2007/0057364 A1 | 3/2007 | Wang et al. |
| 2007/0234563 A1 | 10/2007 | Sakaguchi et al. |
| 2007/0272940 A1 | 11/2007 | Lee et al. |
| 2008/0081161 A1 | 4/2008 | Tomita et al. |
| 2008/0089048 A1 | 4/2008 | Yamano et al. |
| 2008/0136033 A1 | 6/2008 | Nagamatsu et al. |
| 2008/0136041 A1 | 6/2008 | Kotake et al. |
| 2008/0284017 A1 | 11/2008 | Lee et al. |
| 2009/0045512 A1 | 2/2009 | Hedler et al. |
| 2009/0115072 A1 | 5/2009 | Rhyner et al. |
| 2009/0294160 A1 | 12/2009 | Yoshimura et al. |
| 2010/0288541 A1 | 11/2010 | Appelt et al. |
| 2010/0289132 A1 | 11/2010 | Huang et al. |
| 2010/0314744 A1 | 12/2010 | Huang et al. |
| 2010/0320610 A1 | 12/2010 | Huang et al. |
| 2011/0057301 A1 | 3/2011 | Chen et al. |
| 2011/0074008 A1 | 3/2011 | Hsieh |
| 2011/0084370 A1 | 4/2011 | Su et al. |
| 2011/0084372 A1 | 4/2011 | Su et al. |
| 2011/0115082 A1 | 5/2011 | Gluschenkov et al. |
| 2011/0169150 A1 | 7/2011 | Su et al. |

OTHER PUBLICATIONS

Appelt, et al. "A new, cost effective coreless substrate technology." Proc. ICSJ, The IEEE CPMT Symposium Japan, Univ. Tokyo, Tokyo Japan (2010).

Appelt et al., "Single sided substrates and packages based on laminate materials." APM-Microtech, Cambridge UK (Mar. 2010).

Appelt et al., "Single sided substrates-a new opportunity for miniaturizing packages." ICEP (Int'l Conf. on Electronics Packaging), Hokkaido, Japan (May 2010).

Kikuchi, et al., "High-performance FCBGA based on ultra-thin packaging substrante," NEC J. Adv. Tech. vol. 2:3 pp. 222-228 (2005).

English Translation of Abstract only TW200924137, Jun. 1, 2009.

* cited by examiner

SEMICONDUCTOR PACKAGE AND PROCESS FOR FABRICATING SAME

CROSS REFERENCE TO RELATED APPLICATIONS

This application is a continuation of U.S. application Ser. No. 12/904,799, filed Oct. 14, 2010, which claims the benefit of U.S. Provisional Application No. 61/251,396, filed on Oct. 14, 2009, U.S. Provisional Application No. 61/294,519, filed on Jan. 13, 2010, and Taiwan Application No. 99107472, filed on Mar. 15, 2010, the disclosures of which are incorporated herein by reference in their entirety.

FIELD OF THE INVENTION

The present invention relates to a semiconductor package. More particularly, the present invention relates to a package carrier, a package structure, and a process for fabricating a package carrier and a package structure.

BACKGROUND

A chip package serves to protect a bare chip, reduce a density of chip contacts, and provide a good heat dissipation effect for the chip. A common packaging process is to install the chip onto a package carrier, and contacts of the chip are electrically connected to the package carrier. Therefore, distribution of the contacts of the chip can be rearranged through the package carrier to cope with a contact distribution of a next stage external device.

As light weight, compactness, and high efficiency have become typical requirements of consumer electronic and communication products, chip packages should provide superior electrical properties, small overall volume, and a large number of I/O ports. Package carriers used in these chip packages often have multiple metal layers that can be electrically connected through interconnections. As the size of chip packages decreases, these interconnections can become smaller and more closely spaced, which can increase the cost and complexity of packaging processes.

It is against this background that a need arose to develop the package carriers, the package structures, and processes described herein.

SUMMARY

Embodiments of the present invention provide a semiconductor package for packaging a chip. Embodiments of the present invention also provide a process for fabricating the aforementioned semiconductor package.

In one embodiment, a semiconductor package includes: (1) a package carrier, including: a dielectric layer having a plurality of openings; a conductive layer disposed adjacent to a first surface of the dielectric layer; and a plurality of conductive posts disposed in respective ones of the openings, wherein each conductive post is connected to the conductive layer and extends away from the conductive layer without protruding from the respective opening; and (2) a chip attached to the package carrier and connected to the conductive layer.

In another embodiment, a semiconductor package includes: (1) a substrate, including: a dielectric layer having a plurality of openings; a conductive layer disposed adjacent to the dielectric layer; and a plurality of conductive vias disposed in respective ones of the openings; (2) a chip attached to the substrate and connected to the conductive layer; and (3) a plurality of conductive bumps disposed adjacent to respective ones of the conductive vias, wherein a first end of each conductive via is connected to the conductive layer and a second end of the conductive via is connected to the respective conductive bump such that the second end of the conductive via does not protrude from the respective opening.

In a further embodiment, a process of fabricating a semiconductor package includes: (1) providing a conductive layer and a plurality of conductive posts disposed adjacent to the conductive layer; (2) disposing a dielectric layer having a plurality of openings on the conductive layer, wherein the openings are coincident with the conductive posts; and (3) patterning the conductive layer.

As to the above, certain embodiments of the present invention first form a plurality of electrically conductive posts connected to an electrically conductive layer (or a patterned electrically conductive layer) and then form a dielectric layer on the conductive layer (or the patterned conductive layer), wherein the dielectric layer exposes a portion of each of the conductive posts. A semiconductor package described herein has the advantages of reduced package size while coping with a particular circuit layout, and controlling the cost and complexity of packaging processes.

Other aspects and embodiments of the invention are also contemplated. The foregoing summary and the following detailed description are not meant to restrict the invention to any particular embodiment but are merely meant to describe some embodiments of the invention.

BRIEF DESCRIPTION OF THE DRAWINGS

For a better understanding of the nature and objects of some embodiments of the invention, reference should be made to the following detailed description taken in conjunction with the accompanying drawings. In the drawings, like reference numbers denote like elements, unless the context clearly dictates otherwise.

DETAILED DESCRIPTION

Figure 1A:
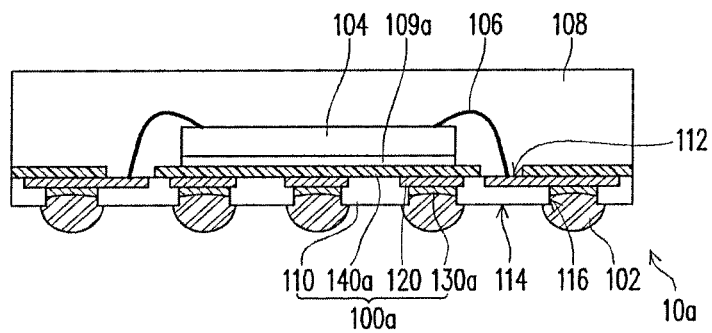
FIG. 1A is a cross-sectional view of a semiconductor package according to an embodiment of the present invention.

FIG. 1A is a cross-sectional view of a semiconductor package 10a according to an embodiment of the present invention. Referring to FIG. 1A, in the present embodiment, the package 10a includes a package carrier 100a (or other substrate), a set of solder balls 102 (or other electrically conductive bumps), a chip 104 (or other active or passive semiconductor device), a set of conductive wires 106, and an encapsulant 108.

Specifically, the package carrier 100a includes a dielectric layer 110, a patterned electrically conductive layer 120, a set of electrically conductive vias, and a patterned solder resist layer 140a. In the illustrated embodiment, the conductive vias correspond to electrically conductive posts 130a, although pillars and other hollow or solid structures can be used. The dielectric layer 110 includes a first surface 112 and a second surface 114 faced away from the first surface 112, and defines a set of openings 116. A material of the dielectric layer 110 can include a resin, such as Ammonium Bifluoride, Ajinomoto build-up film (ABF), Bismaleimide Triazine (BT), Polyimide (PI), liquid crystal polymer (LCP), epoxy resin, or a combination thereof. These resin materials can be mixed with glass fibers, such as in the form of a fiber pad or other types of fibers to strengthen the dielectric layer 110.

The patterned conductive layer 120 is embedded in the dielectric layer 110 and is disposed adjacent to the first surface 112 of the dielectric layer 110. In other words, the patterned conductive layer 120 can be taken as an embedded circuit, and an exposed surface (e.g., a top surface) of the patterned conductive layer 120 is aligned (e.g., substantially aligned) with the first surface 112 of the dielectric layer 110. The patterned conductive layer 120 can include a metal, a metal alloy, or other electrically conductive material. The conductive posts 130a are respectively disposed in the openings 116, wherein the openings 116 extend from the second surface 114 of the dielectric layer 110 to the patterned conductive layer 120, and the conductive posts 130a are connected to the patterned conductive layer 120. The conductive posts 130a can include a metal (e.g., copper), a metal alloy, or other electrically conductive material. In the present embodiment, a height (or other characteristic vertical extent) of each of the conductive posts 130a is less than a depth (or other characteristic vertical extent) of the corresponding opening 116, such that the conductive posts 130a do not protrude from the corresponding openings 116. The patterned solder resist layer 140a is disposed adjacent to the first surface 112 of the dielectric layer 110 and exposes a portion of the patterned conductive layer 120. The exposed portion of the patterned conductive layer 120 can be taken as a set of contact pads.

The solder balls 102 are disposed adjacent to the second surface 114 of the dielectric layer 110 and are located adjacent to their respective conductive posts 130a. In the present embodiment, since the height of each of the conductive posts 130a is less than the depth of the corresponding opening 116, a portion (e.g., a top portion) of each of the solder balls 102 is located in the corresponding opening 116.

The chip 104 is mounted adjacent to the package carrier 100a and located adjacent to the first surface 112 of the dielectric layer 110. In the present embodiment, the package 10a further includes an adhesive layer 109a, wherein the adhesive layer 109a is disposed between the chip 104 and the patterned solder resist layer 140a to bond the chip 104 to the package carrier 100a.

The chip 104 is electrically connected to the portion of the patterned conductive layer 120 exposed by the patterned solder resist layer 140a through the conductive wires 106. The encapsulant 108 covers the chip 104, the conductive wires 106, and a portion of the package carrier 100a.

By forming connections to the patterned conductive layer 120 (i.e., the embedded circuit) through the conductive posts 130a, the package 10a of the present embodiment has the advantages of reduced package size while coping with a particular circuit layout (e.g., the layout of the patterned conductive layer 120), and controlling the cost and complexity of packaging processes. In addition, by forming the conductive posts 130a within the dielectric layer 110, the stress imparted by external forces, such as attributable to mechanical shock, is compensated for, and the reliability of the package 10a is improved.

An overall thickness of the package carrier 100a can be in the range of about 40 µm to about 150 µm, and can also be in one of the ranges of about 40 µm to about 60 µm, about 60 µm to about 80 µm, about 80 µm to about 100 µm, about 80 µm to about 120 µm, and about 40 µm to about 130 µm, although the thickness of the package carrier 100a is not constrained to any of these ranges. At the same time, the package carrier 100a can also be sufficiently strong and rigid so that warpage is sufficiently small to meet practical application requirements. In some embodiments, the tensile modulus or Young's modulus of the package carrier 100a (or a portion thereof, such as the dielectric layer 110) can be in the range of about 10 GPa to about 40 GPa, such as from about 15 GPa to about 40 GPa, from about 20 GPa to about 40 GPa, or from about 30 GPa to about 40 GPa.

Figure 1B:
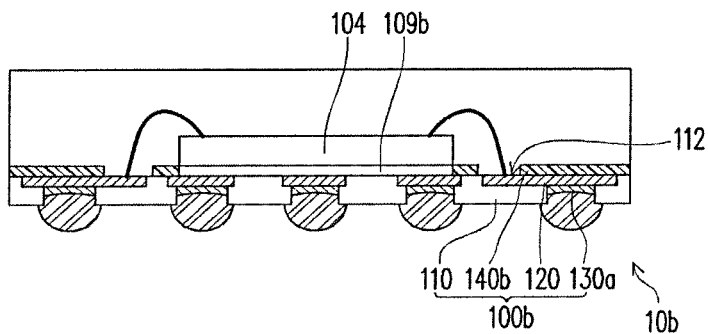
FIG. 1B to FIG. 1H are cross-sectional views of packages according to various embodiments of the present invention.

FIG. 1B is a cross-sectional view of a package 10b according to another embodiment of the present invention. Referring to both FIG. 1A and FIG. 1B, the package 10b of FIG. 1B is similar to the package 10a of FIG. 1A. At least one difference is that an adhesive layer 109b of the package 10b of FIG. 1B is disposed between the chip 104 and a portion of the patterned conductive layer 120 exposed by a patterned solder resist layer 140b of a package carrier 100b.

Figure 1C:
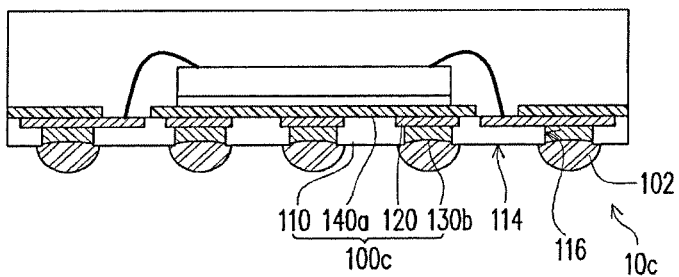

FIG. 1C is a cross-sectional view of a package 10c according to another embodiment of the present invention. Referring to both FIG. 1A and FIG. 1C, in the present embodiment, the package 10c of FIG. 1C is similar to the package 10a of FIG. 1A. At least one difference is that a height of each conductive post 130b of a package carrier 100c of FIG. 1C is substantially equal to a depth of the corresponding opening 116. In other words, an end (e.g., a lower end) of each conductive post 130b is aligned (e.g., substantially aligned or coplanar) with the second surface 114 of the dielectric layer 110, and the solder balls 102 are disposed adjacent to their respective conductive posts 130b, with little or no portions of the solder balls 102 disposed in the openings 116.

Figure 1D:
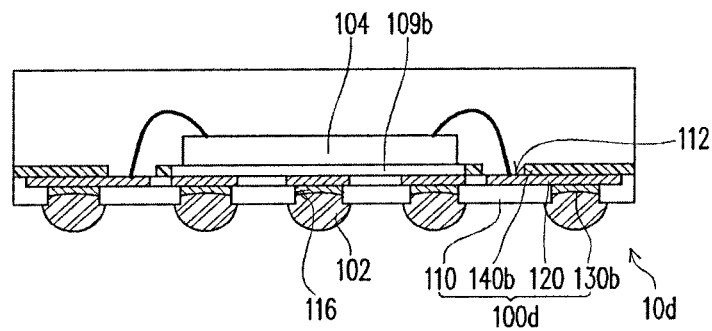

FIG. 1D is a cross-sectional view of a package 10d according to another embodiment of the present invention. Referring to both FIG. 1A and FIG. 1D, the package 10d of FIG. 1D is similar to the package 10a of FIG. 1A. At least one difference is that the adhesive layer 109b of the package 10d of FIG. 1D is disposed between the chip 104 and a portion of the patterned conductive layer 120 exposed by the patterned solder resist layer 140b of a package carrier 100d. In addition, the height of each conductive post 130b of the package carrier 100d is substantially equal to the depth of the corresponding opening 116. In other words, an end (e.g., a lower end) of each conductive post 130b is aligned (e.g., substantially aligned or coplanar) with the second surface 114 of the dielectric layer 110, and the solder balls 102 are disposed adjacent to their respective conductive posts 130b, with little or no portions of the solder balls 102 disposed in the openings 116.

Figure 1E:
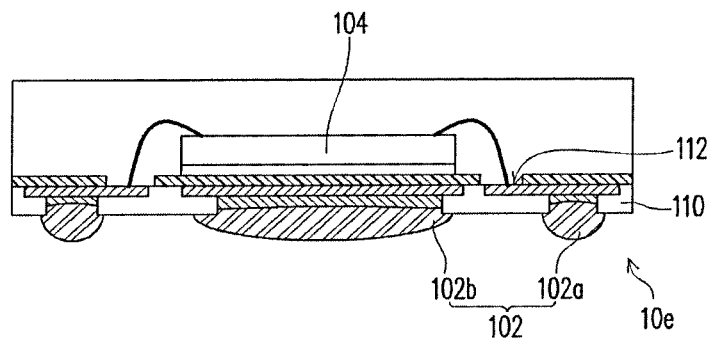

FIG. 1E is a cross-sectional view of a package 10e according to another embodiment of the present invention. Referring to both FIG. 1A and FIG. 1E, the package 10e of FIG. 1E is similar to the package 10a of FIG. 1A. At least one difference is that the solder balls 102 of the package 10e include a set of first solder balls 102a and a second solder ball 102b. An orthographic projection of the second solder ball 102b on the first surface 112 of the dielectric layer 110 is overlapped with an orthographic projection of the chip 104 on the first surface 112 of the dielectric layer 110. In other words, a lateral periphery of the second solder ball 102b overlaps to at least some degree with a lateral periphery of the chip 104, when viewed from the top or the bottom of the package 10e. Also, a size (e.g., a characteristic lateral extent) of each of the first solder balls 102a is smaller than a size of the second solder ball 102b, and a size (e.g., a characteristic lateral extent) of a conductive post 130a associated with each of the first solder balls 102a is smaller than a size of a conductive post 130a associated with the second solder ball 102b.

Figure 1F:
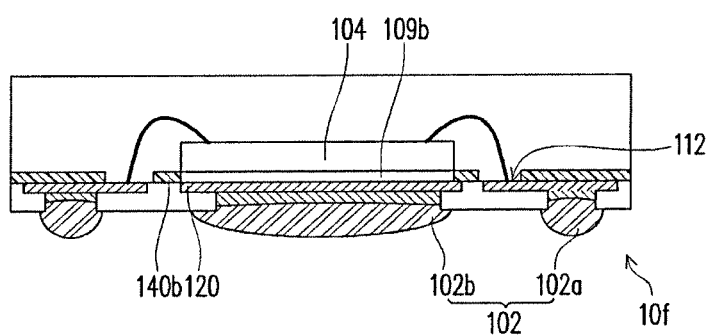

FIG. 1F is a cross-sectional view of a package 10f according to another embodiment of the present invention. Referring to both FIG. 1A and FIG. 1F, the package 10f of FIG. 1F is similar to the package 10a of FIG. 1A. At least one difference is that the adhesive layer 109b of the package 10f of FIG. 1F is disposed between the chip 104 and a portion of the patterned conductive layer 120 exposed by the patterned solder resist layer 140b. In addition, the solder balls 102 of the package 10f include the first solder balls 102a and the second solder ball 102b, similar to that of the package 10e of FIG. 1E.

Figure 1G:
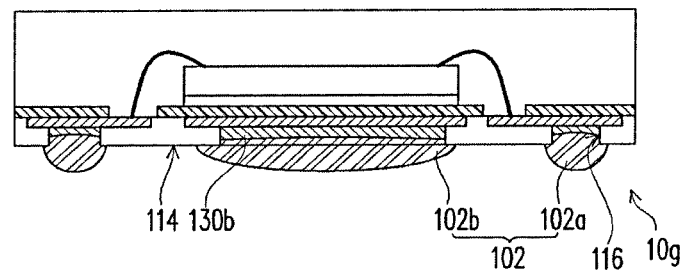

FIG. 1G is a cross-sectional view of a package 10g according to another embodiment of the present invention. Referring to both FIG. 1A and FIG. 1G, the package 10g of FIG. 1G is similar to the package 10a of FIG. 1A. At least one difference is that the solder balls 102 of the package 10g include the first solder balls 102a and the second solder ball 102b, similar to that of the package 10e of FIG. 1E. In addition and referring to FIG. 1G, the height of each conductive post 130b is substantially equal to the depth of the corresponding opening 116. In other words, an end (e.g., a lower end) of each conductive post 130b is aligned (e.g., substantially aligned or coplanar) with the second surface 114 of the dielectric layer 110, and the solder balls 102 are disposed adjacent to their respective conductive posts 130b, with little or no portions of the solder balls 102 disposed in the openings 116.

Figure 1H:
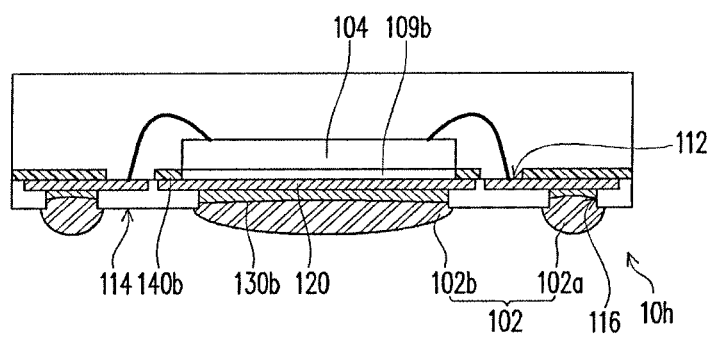

FIG. 1H is a cross-sectional view of a package 10h according to another embodiment of the present invention. Referring to both FIG. 1A and FIG. 1H, the package 10h of FIG. 1H is similar to the package 10a of FIG. 1A. At least one difference is that the adhesive layer 109b of the package 10h of FIG. 1H is disposed between the chip 104 and a portion of the patterned conductive layer 120 exposed by the patterned solder resist layer 140b. In addition, the solder balls 102 of the package 10h include the first solder balls 102a and the second solder ball 102b, similar to that of the package 10e of FIG. 1E. In addition and referring to FIG. 1H, the height of each conductive post 130b is substantially equal to the depth of the corresponding opening 116. In other words, an end (e.g., a lower end) of each conductive post 130b is aligned (e.g., substantially aligned or coplanar) with the second surface 114 of the dielectric layer 110, and the solder balls 102 are disposed adjacent to their respective conductive posts 130b, with little or no portions of the solder balls 102 disposed in the openings 116.

Figure 2A:
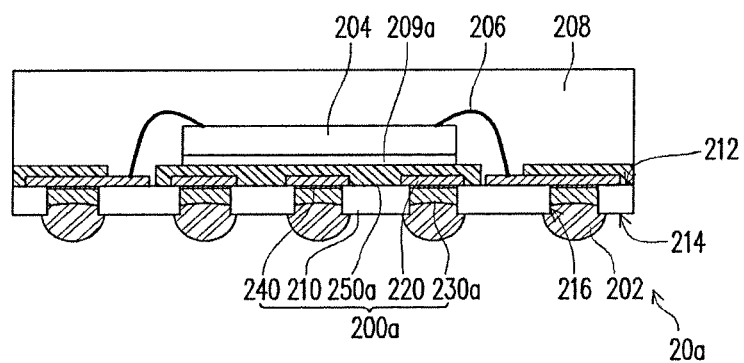
FIG. 2A is a cross-sectional view of a package according to another embodiment of the present invention.

FIG. 2A is a cross-sectional view of a package 20a according to another embodiment of the present invention. Referring to FIG. 2A, in the present embodiment, the package 20a includes a package carrier 200a, a set of solder balls 202, a chip 204, a set of conductive wires 206, and an encapsulant 208. Certain aspects of the package 20a can be similar to that previously discussed for FIG. 1A through FIG. 1H, and those aspects are not repeated below.

Specifically, the package carrier 200a includes a dielectric layer 210, a patterned electrically conductive layer 220, a set of electrically conductive posts 230a, a patterned etching stop layer 240 (or other barrier layer), and a patterned solder resist layer 250a. The dielectric layer 210 includes a first surface 212 and a second surface 214 faced away from the first surface 212, and defines a set of through holes 216 extending from the first surface 212 to the second surface 214. The patterned conductive layer 220 is disposed adjacent to and above the first surface 212 of the dielectric layer 210 and covers an end of each of the through holes 216. In other words, the patterned conductive layer 220 can be taken as an non-embedded circuit. The conductive posts 230a are respectively disposed in the through holes 216. In the present embodiment, a height of each of the conductive posts 230a is less than a depth of the corresponding through hole 216. The patterned etching stop layer 240 is disposed in the through holes 216 and located between the conductive posts 230a and the patterned conductive layer 220, wherein the conductive posts 230a can be connected to the patterned conductive layer 220 through the patterned etching stop layer 240 that is formed of, for example, nickel or another electrically conductive material. The patterned solder resist layer 250a is disposed adjacent to the first surface 212 of the dielectric layer 210 and covers the patterned conductive layer 220, wherein the patterned solder resist layer 250a exposes a portion of the patterned conductive layer 220. The exposed portion of the patterned conductive layer 220 can be taken as a set of contact pads.

The solder balls 202 are disposed adjacent to the second surface 214 of the dielectric layer 210 and are located adjacent to their respective conductive posts 230a. In the present embodiment, since the height of each of the conductive posts 230a is less than the depth of the corresponding through hole 216, a portion (e.g., a top portion) of each of the solder balls 202 is located in the corresponding through hole 216.

The chip 204 is mounted adjacent to the package carrier 200a and located adjacent to the first surface 212 of the dielectric layer 210. In the present embodiment, the package 20a further includes an adhesive layer 209a, wherein the adhesive layer 209a is disposed between the chip 204 and the patterned solder resist layer 250a to bond the chip 204 to the package carrier 200a.

The chip 204 is electrically connected to the portion of the patterned conductive layer 220 exposed by the patterned solder resist layer 250a through the conductive wires 206. The encapsulant 208 covers the chip 204, the conductive wires 206, and a portion of the package carrier 200a.

By forming connections to the patterned conductive layer 220 (i.e., the non-embedded circuit) through the conductive posts 230a, the package 20a of the present embodiment has the advantages of reduced package size while coping with a particular circuit layout (e.g., the layout of the patterned conductive layer 220), and controlling the cost and complexity of packaging processes.

Figure 2B:
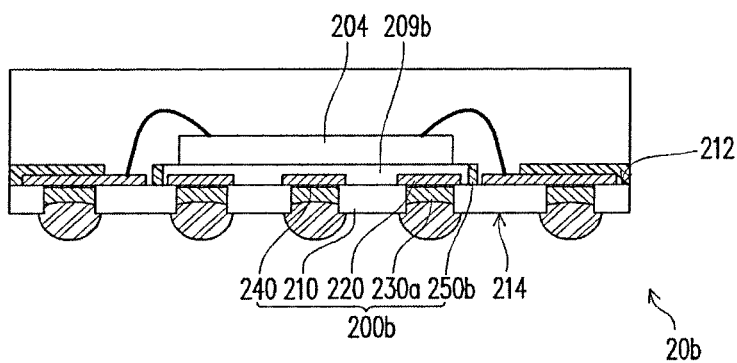
FIG. 2B to FIG. 2D are cross-sectional views of packages according to various embodiments of the present invention.

FIG. 2B is a cross-sectional view of a package 20b according to another embodiment of the present invention. Referring to both FIG. 2A and FIG. 2B, the package 20b of FIG. 2B is similar to the package 20a of FIG. 2A. At least one difference is that an adhesive layer 209b of the package 20b of FIG. 2B is disposed between the chip 204 and a portion of the patterned conductive layer 220 exposed by a patterned solder resist layer 250b of a package carrier 200b.

Figure 2C:
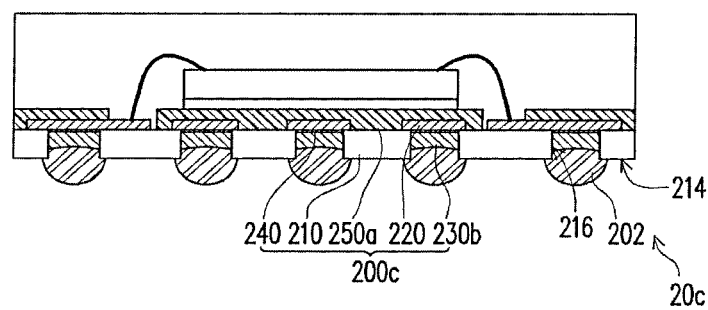

FIG. 2C is a cross-sectional view of a package 20c according to another embodiment of the present invention. Referring to both FIG. 2A and FIG. 2C, the package 20c of FIG. 2C is similar to the package 20a of FIG. 2A. At least one difference is that a height of each conductive post 230b of a package carrier 200c of FIG. 2C is substantially equal to a depth of the corresponding through hole 216. In other words, an end (e.g., a lower end) of each conductive post 230b is aligned (e.g., substantially aligned or coplanar) with the second surface 214 of the dielectric layer 210, and the solder balls 202 are disposed adjacent to their respective conductive posts 230b, with little or no portions of the solder balls 202 disposed in the through holes 216.

Figure 2D:
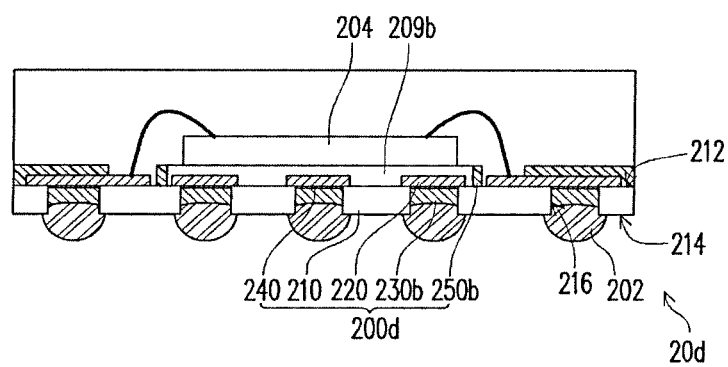

FIG. 2D is a cross-sectional view of a package 20d according to another embodiment of the present invention. Referring to both FIG. 2A and FIG. 2D, the package 20d of FIG. 2D is similar to the package 20a of FIG. 2A. At least one difference is that the adhesive layer 209b of the package 20d of FIG. 2D is disposed between the chip 204 and a portion of the patterned conductive layer 220 exposed by the patterned solder resist layer 250b of a package carrier 200d. In addition, the height of each conductive post 230b is substantially equal to the depth of the corresponding through hole 216. In other words, an end (e.g., a lower end) of each conductive post 230b is aligned (e.g., substantially aligned or coplanar) with the second surface 214 of the dielectric layer 210, and the solder balls 202 are disposed adjacent to their respective conductive posts 230b, with little or no portions of the solder balls 202 disposed in the through holes 216.

In some embodiments, a surface finishing or passivation layer (not shown) can be disposed adjacent to an exposed surface of a patterned conductive layer to facilitate wire-bonding, which surface passivation layer can include nickel/gold, nickel/cadmium/gold, nickel/silver, gold, tin, alloys thereof (e.g., a tin-lead alloy), silver, electroless nickel electroless palladium immersion gold (ENEPIG), or a combination thereof.

Although the chip 104 or 204 in the aforementioned embodiments is electrically connected to the patterned conductive layer 120 or 220 through a wire-bonding technique, the chip 104 or 204 can also be electrically connected to the patterned conductive layer 120 or 220 through a flip-chip bonding technique, such as by having an exposed surface of the patterned conductive layer 120 or 220 located below the chip 104 or 204. In particular, the chip 104 or 204 can be connected to the exposed surface of the patterned conductive layer 120 or 220 through conductive bumps, such as solder bumps, copper pillars, copper stud bumps, or golden stud bumps. Moreover, an underfill material can be disposed between the chip 104 or 204 and a package carrier for encapsulating or wrapping the conductive bumps.

Processes of fabricating package carriers 300, 400, 500 and 600 are illustrated in the following embodiments accompanying FIG. 3A to FIG. 3R, FIG. 4A to FIG. 4Q, FIG. 5A to FIG. 5M, and FIG. 6A to FIG. 6M.

Figure 3A:
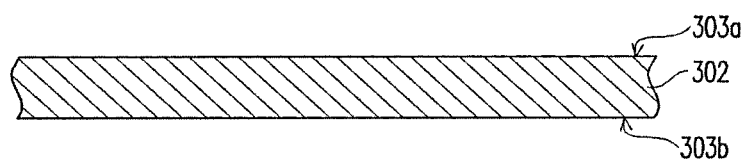
FIG. 3A to FIG. 3R illustrate a process of fabricating a package carrier according to an embodiment of the present invention.
Figure 3B:
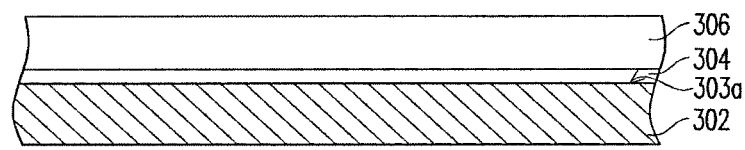
Figure 3C:
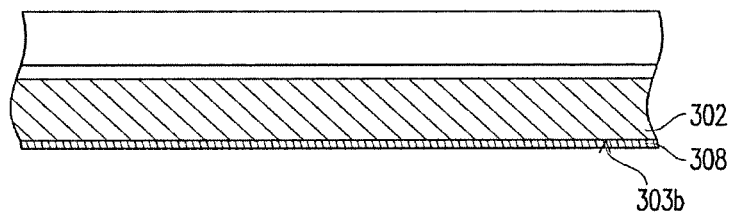
Figure 3D:
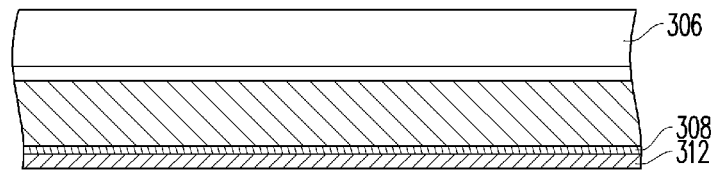
Figure 3E:
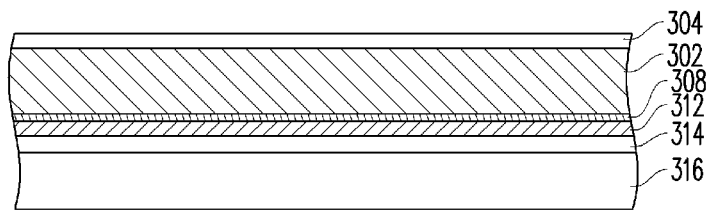
Figure 3F:
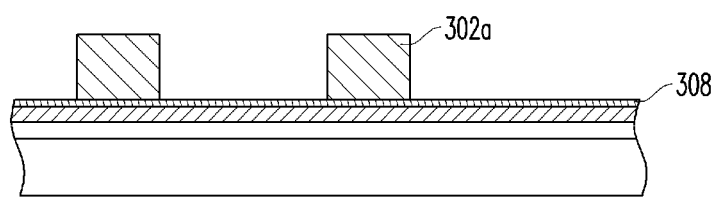
Figure 3G:
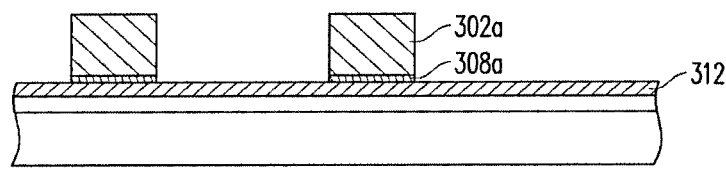
Figure 3H:
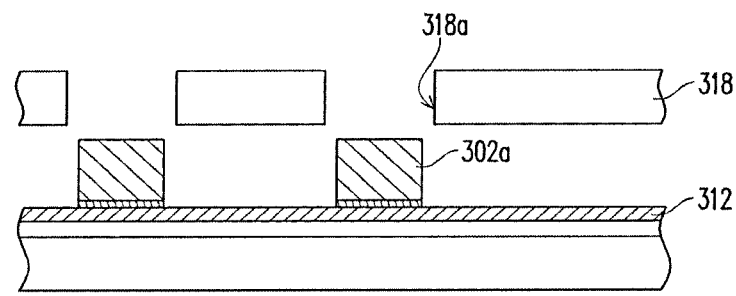
Figure 3I:
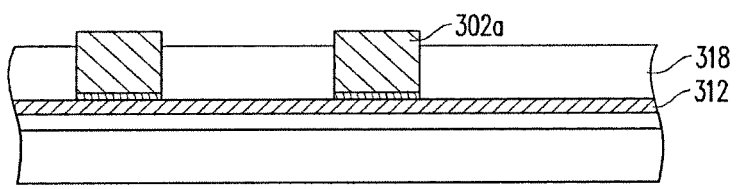
Figure 3J:
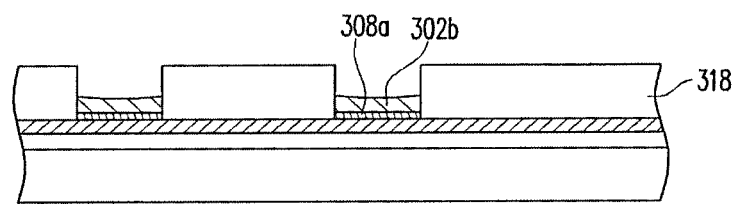
Figure 3K:
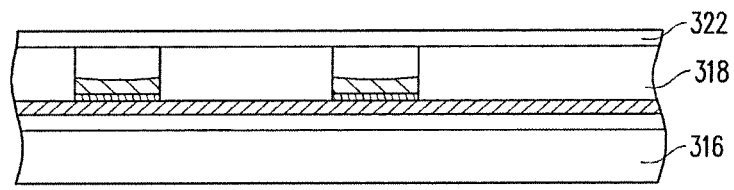
Figure 3L:
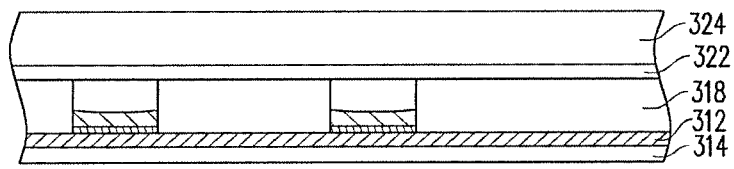
Figure 3M:
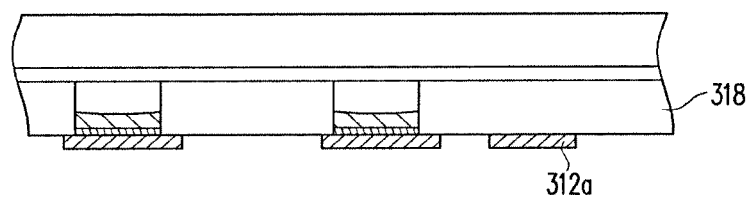
Figure 3N:
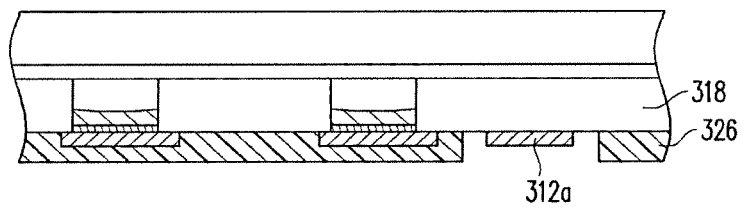
Figure 3O:
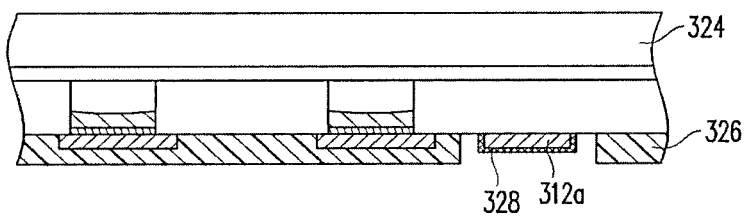
Figure 3P:
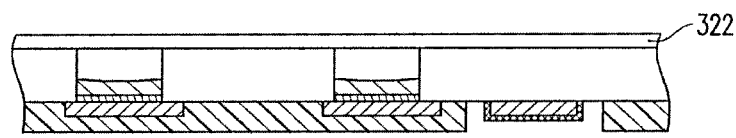
Figure 3Q:
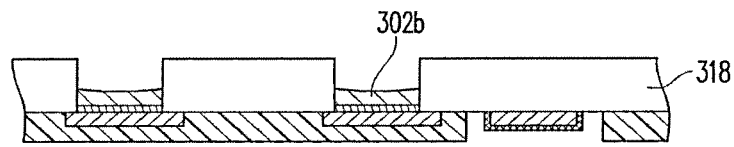
Figure 3R:
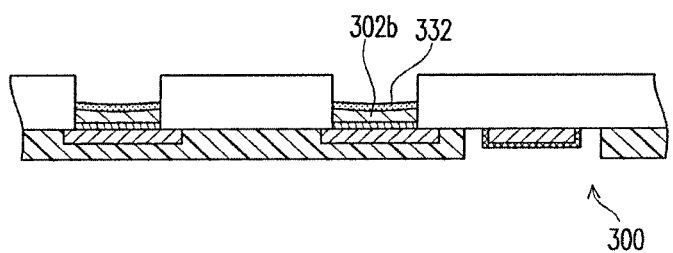

FIG. 3A to FIG. 3R illustrate a process of fabricating the package carrier 300 according to an embodiment of the present invention. Referring to FIG. 3A, in the present embodiment, an initial electrically conductive layer 302 including a first surface 303a and a second surface 303b faced away from the first surface 303a is provided. The initial conductive layer 302 can be a copper foil, or can be formed of another metal, a metal alloy, or other suitable electrically conductive material.

Then, referring to FIG. 3B, a first carrier 306 and a first dry film layer 304 are disposed adjacent to the first surface 303a of the initial conductive layer 302, wherein the first dry film layer 304 is located between the first carrier 306 and the initial conductive layer 302.

Next, referring to FIG. 3C, an etching stop layer 308 is formed adjacent to the second surface 303b of the initial conductive layer 302, such as by deposition or lamination. The etching stop layer 308 can be formed of nickel, or can be formed of another metal, a metal alloy, or other suitable electrically conductive material.

Then, referring to FIG. 3D, an electrically conductive layer 312 is formed adjacent to the etching stop layer 308, such as by deposition or lamination. The conductive layer 312 can be formed of copper, or can be formed of another metal, a metal alloy, or other suitable electrically conductive material.

Next, referring to FIG. 3E, the first carrier 306 is removed to expose the first dry film layer 304, and a second carrier 316 and a second dry film layer 314 are disposed adjacent to the conductive layer 312, wherein the second dry film layer 314 is located between the second carrier 316 and the conductive layer 312.

Referring to both FIG. 3E and FIG. 3F, the initial conductive layer 302 is patterned to form a set of electrically conductive posts 302a. In the present embodiment, patterning the initial conductive layer 302 includes patterning the first dry film layer 304 to form a first patterned dry film layer (not shown), and etching the initial conductive layer 302 to form the conductive posts 302a, by using the first patterned dry film as an etching mask and exposing the etching stop layer 308. Then, the first patterned dry film layer is removed.

Next, referring to FIG. 3G, a portion of the etching stop layer 308 exposed outside the conductive posts 302a is removed to expose a portion of the conductive layer 312, and a patterned etching stop layer 308a is accordingly formed under the conductive posts 302a.

Then, referring to both FIG. 3H and FIG. 3I, a dielectric layer 318 is laminated over the conductive layer 312 and then compressed onto the conductive layer 312 by a thermal compressing process, wherein the conductive posts 302a respectively extend through a set of openings 318a pre-defined in the dielectric layer 318 and are exposed by the dielectric layer 318. The dielectric layer 318 can be, for example, a prepreg.

Next, referring to FIG. 3J, a portion of each of the conductive posts 302a is removed to form a set of truncated conductive posts 302b, wherein a sum of a height of one of the conductive posts 302b and a thickness of the patterned etching stop layer 308a is less than a thickness of the dielectric layer 318. In the present embodiment, a portion of each of the conductive posts 302a can be removed by etching or another material removal technique, such that an end of each of the conductive posts 302b facing away from the conductive layer 312 is concave or has another curved profile.

Then, referring to FIG. 3K, a third dry film layer 322 is disposed adjacent to the dielectric layer 318.

Next, referring to FIG. 3L, the second carrier 316 adjacent to the second dry film layer 314 is removed, and a third carrier 324 is disposed adjacent to the third dry film layer 322, wherein the third dry film layer 322 is located between the third carrier 324 and the dielectric layer 318.

Then, referring to both FIG. 3L and FIG. 3M, the conductive layer 312 is patterned to form a patterned electrically conductive layer 312a. In the present embodiment, patterning the conductive layer 312 includes patterning the second dry film layer 314 to form a second patterned dry film layer (not shown), and etching the conductive layer 312 to form the patterned conductive layer 312a, by using the second patterned dry film as an etching mask and exposing a portion of the dielectric layer 318. Then, the second patterned dry film layer is removed.

Next, referring to FIG. 3N, a patterned solder resist layer 326 is formed adjacent to the dielectric layer 318, wherein the patterned solder resist layer 326 exposes a portion of the patterned conductive layer 312a.

Then, referring to FIG. 3O, a surface passivation layer 328 is formed adjacent to and covers the portion of the patterned conductive layer 312a exposed by the patterned solder resist layer 326. It is noted that the surface passivation layer 328 can reduce the oxidation rate of the patterned conductive layer 312a and can enhance bonding between the patterned conductive layer 312a and conductive wires (not shown), when the patterned conductive layer 312a serves as bonding pads for a wire-bonding technique. The surface passivation layer 328 can include nickel/gold, nickel/cadmium/gold, nickel/silver, gold, tin, alloys thereof (e.g., a tin-lead alloy), silver, ENEPIG, or a combination thereof.

Next, referring to FIG. 3P, the third carrier 324 is removed to expose the third dry film layer 322.

Then, referring to FIG. 3Q, the third dry film layer 322 is removed to expose the dielectric layer 318 and the conductive posts 302b.

After that, referring to FIG. 3R, a surface passivation layer 332 is formed adjacent to the conductive posts 302b, wherein the surface passivation layer 332 can be an anti-oxidation layer, such as an Organic Solderability Preservative (OSP) to reduce the oxidation rate of the conductive posts 302b. The OSP can include benzotriazole, benzimidazoles, or combinations and derivatives thereof. In such manner, the package carrier 300 is formed.

The present embodiment forms the conductive posts 302a that are connected to the conductive layer 312, compresses the dielectric layer 318 onto the conductive layer 312 while exposing a portion of each of the conductive posts 302a, and then forms the patterned conductive layer 312a to obtain the package carrier 300 including a non-embedded circuit and the conductive posts 302b.

Once the package carrier 300 is fabricated, a package according to an embodiment of the invention can be fabricated by disposing a chip (e.g., the chip 204 in FIG. 2A) adjacent to the package carrier 300, electrically connecting the chip to the patterned conductive layer 312a, and disposing solder balls (e.g., the solder balls 202 of FIG. 2A) adjacent to the conductive posts 302b. By forming connections to the patterned conductive layer 312a (i.e., the non-embedded circuit) through the conductive posts 302b, the resulting package has the advantages of reduced package size while coping with a particular circuit layout (e.g., the layout of the patterned conductive layer 312a), and controlling the cost and complexity of packaging processes.

Figure 4A:
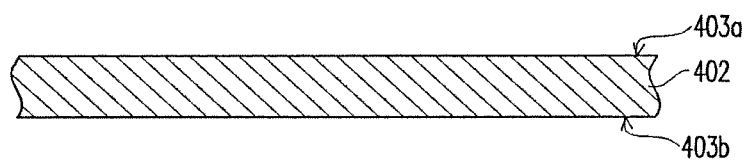
FIG. 4A to FIG. 4Q illustrate a process of fabricating a package carrier according to another embodiment of the present invention.
Figure 4B:
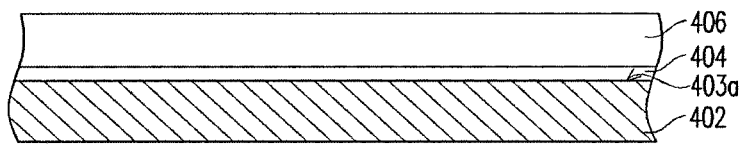
Figure 4C:
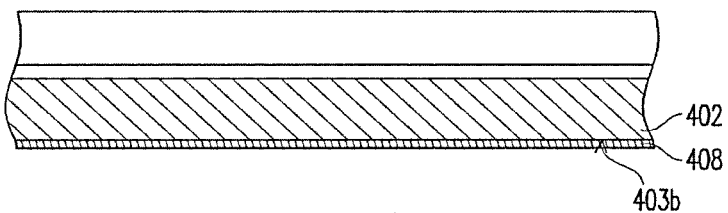
Figure 4D:
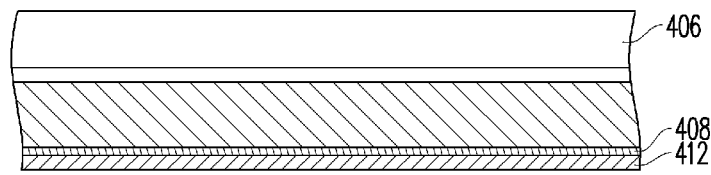
Figure 4E:
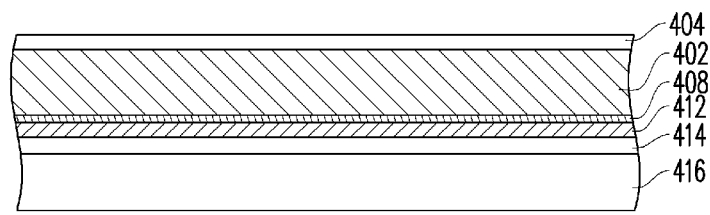
Figure 4F:
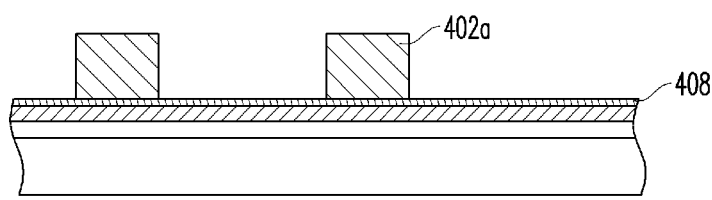
Figure 4G:
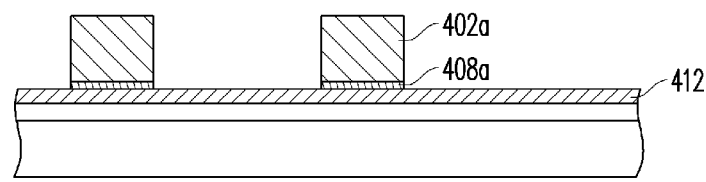
Figure 4H:
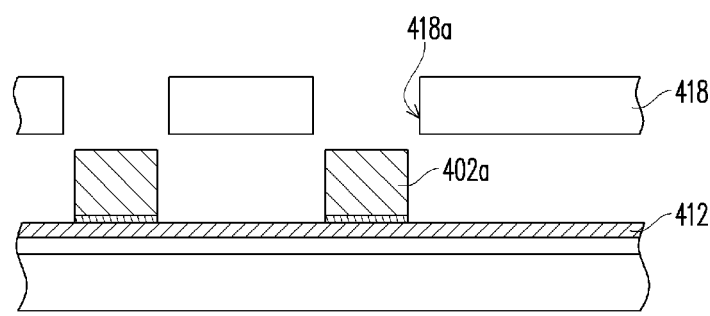
Figure 4I:
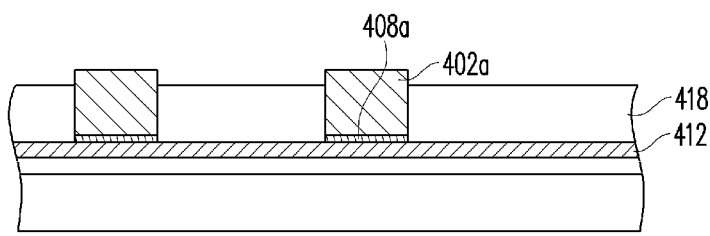
Figure 4J:
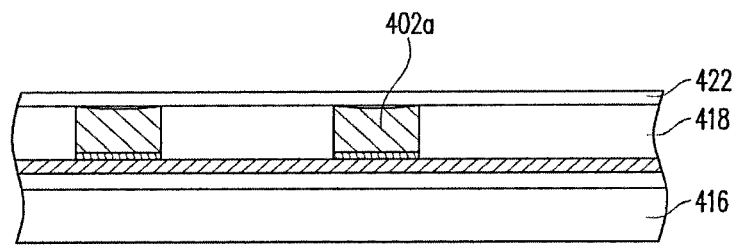
Figure 4K:
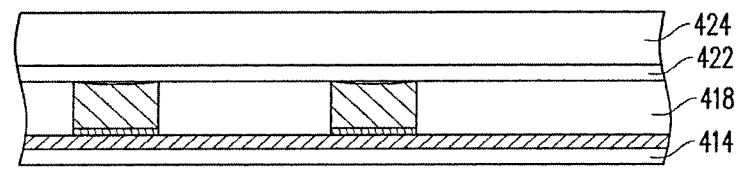
Figure 4L:
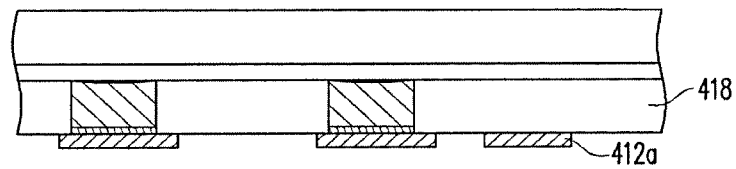
Figure 4M:
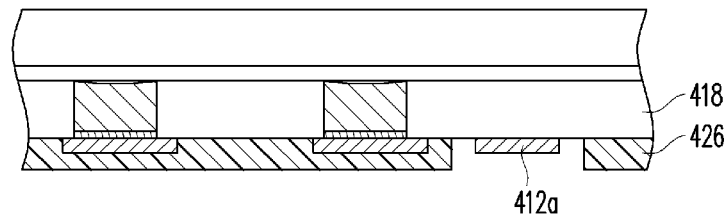
Figure 4N:
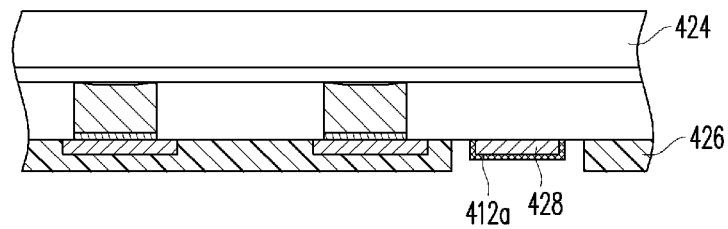
Figure 4O:
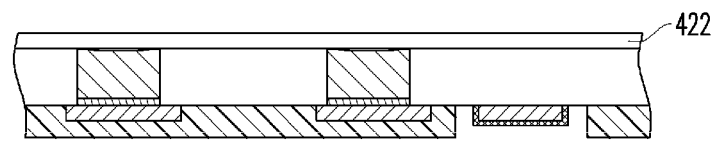
Figure 4P:
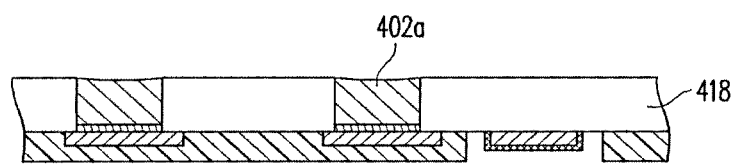
Figure 4Q:
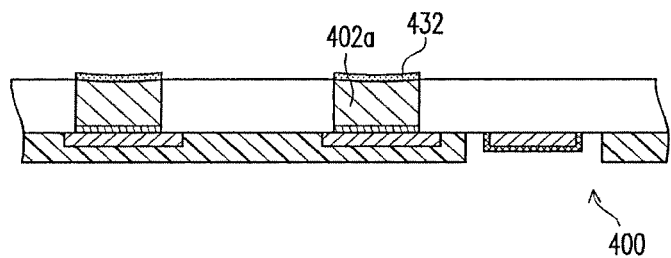

FIG. 4A to FIG. 4Q illustrate a process of fabricating the package carrier 400 according to an embodiment of the present invention. Referring to FIG. 4A, in the present embodiment, an initial electrically conductive layer 402 including a first surface 403a and a second surface 403b faced away from the first surface 403a is provided. The initial conductive layer 402 can be a copper foil, or can be formed of another metal, a metal alloy, or other suitable electrically conductive material.

Then, referring to FIG. 4B, a first carrier 406 and a first dry film layer 404 are disposed adjacent to the first surface 403a of the initial conductive layer 402, wherein the first dry film layer 404 is located between the first carrier 406 and the initial conductive layer 402.

Next, referring to FIG. 4C, an etching stop layer 408 is formed adjacent to the second surface 403b of the initial conductive layer 402, such as by deposition or lamination. The etching stop layer 408 can be formed of nickel, or can be formed of another metal, a metal alloy, or other suitable electrically conductive material.

Then, referring to FIG. 4D, an electrically conductive layer 412 is formed adjacent to the etching stop layer 408, such as by deposition or lamination. The conductive layer 412 can be formed of copper, or can be formed of another metal, a metal alloy, or other suitable electrically conductive material.

Next, referring to FIG. 4E, the first carrier 406 is removed to expose the first dry film layer 404, and a second carrier 416 and a second dry film layer 414 are disposed adjacent to the conductive layer 412, wherein the second dry film layer 414 is located between the second carrier 416 and the conductive layer 412.

Referring to both FIG. 4E and FIG. 4F, the initial conductive layer 402 is patterned to form a set of electrically conductive posts 402a. In the present embodiment, patterning the initial conductive layer 402 includes patterning the first dry film layer 404 to form a first patterned dry film layer (not shown), and etching the initial conductive layer 402 to form the conductive posts 402a, by using the first patterned dry film as an etching mask and exposing the etching stop layer 408. Then, the first patterned dry film layer is removed.

Next, referring to FIG. 4G, a portion of the etching stop layer 408 exposed outside the conductive posts 402a is removed to expose a portion of the conductive layer 412, and a patterned etching stop layer 408a is accordingly formed under the conductive posts 402a.

Then, referring to both FIG. 4H and FIG. 4I, a dielectric layer 418 is laminated over the conductive layer 412 and then compressed onto the conductive layer 412 by a thermal compressing process, wherein the conductive posts 402a respectively extend through a set of openings 418a pre-defined in the dielectric layer 418 and are exposed by the dielectric layer 418. The dielectric layer 418 can be, for example, a prepreg. In the present embodiment, a sum of a height of one of the conductive posts 402a and a thickness of the patterned etching stop layer 408a is substantially equal to a thickness of the dielectric layer 418. Also, a portion of each of the conductive posts 402a can be removed by etching or another material removal technique, such that an end of each of the conductive posts 402a facing away from the conductive layer 412 is concave or has another curved profile.

Then, referring to FIG. 4J, a third dry film layer 422 is disposed adjacent to the dielectric layer 418, wherein an end of each of the conductive posts 402a directly contacts the third dry film layer 422.

Next, referring to FIG. 4K, the second carrier 416 adjacent to the second dry film layer 414 is removed, and a third carrier 424 is disposed adjacent to the third dry film layer 422, wherein the third dry film layer 422 is located between the third carrier 424 and the dielectric layer 418.

Then, referring to both FIG. 4K and FIG. 4L, the conductive layer 412 is patterned to form a patterned electrically conductive layer 412a. In the present embodiment, patterning the conductive layer 412 includes patterning the second dry film layer 414 to form a second patterned dry film layer (not shown), and etching the conductive layer 412 to form the patterned conductive layer 412a, by using the second patterned dry film as an etching mask and exposing a portion of the dielectric layer 418. Then, the second patterned dry film layer is removed.

Next, referring to FIG. 4M, a patterned solder resist layer 426 is formed adjacent to the dielectric layer 418, wherein the patterned solder resist layer 426 exposes a portion of the patterned conductive layer 412a.

Then, referring to FIG. 4N, a surface passivation layer 428 is formed adjacent to and covers the portion of the patterned conductive layer 412a exposed by the patterned solder resist layer 426. It is noted that the surface passivation layer 428 can reduce the oxidation rate of the patterned conductive layer 412a and can enhance bonding between the patterned conductive layer 412a and conductive wires (not shown), when the patterned conductive layer 412a serves as bonding pads for a wire-bonding technique. The surface passivation layer 428 can include nickel/gold, nickel/cadmium/gold, nickel/silver, gold, tin, alloys thereof (e.g., a tin-lead alloy), silver, ENEPIG, or a combination thereof.

Next, referring to FIG. 4O, the third carrier 424 is removed to expose the third dry film layer 422.

Then, referring to FIG. 4P, the third dry film layer 422 is removed to expose the dielectric layer 418 and the conductive posts 402a.

After that, referring to FIG. 4Q, a surface passivation layer 432 is formed adjacent to the conductive posts 402a, wherein the surface passivation layer 432 can be an anti-oxidation layer, such as an OSP to reduce the oxidation rate of the conductive posts 402a. In such manner, the package carrier 400 is formed.

Once the package carrier 400 is fabricated, a package according to an embodiment of the invention can be fabricated by disposing a chip (e.g., the chip 204 in FIG. 2C) adjacent to the package carrier 400, electrically connecting the chip to the patterned conductive layer 412a, and disposing solder balls (e.g., the solder balls 202 of FIG. 2C) adjacent to the conductive posts 402a.

Figure 5A:
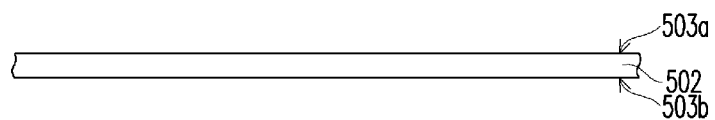
FIG. 5A to FIG. 5M illustrate a process of fabricating a package carrier according to another embodiment of the present invention.

FIG. 5A to FIG. 5M illustrate a process of fabricating the package carrier 500 according to an embodiment of the present invention. Referring to FIG. 5A, in the present embodiment, an initial electrically conductive layer 502 including a first surface 503a and a second surface 503b faced away from the first surface 503a is provided. The initial conductive layer 502 can be a copper foil, or can be formed of another metal, a metal alloy, or other suitable electrically conductive material.

Figure 5B:
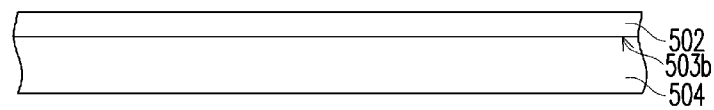

Next, referring to FIG. 5B, a first carrier 504 is disposed adjacent to the second surface 503b of the initial conductive layer 502.

Figure 5C:
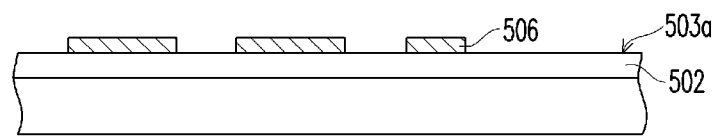

Then, referring to FIG. 5C, a patterned electrically conductive layer 506 is formed adjacent to the first surface 503a of the initial conductive layer 502 by a semi-additive process. Specifically, a dielectric material, a photo-resist, or another applicable material serving as a temporary mask is disposed adjacent to the initial conductive layer 502. Then, the mask is patterned to form a set of openings at locations corresponding to the patterned conductive layer 506. The patterned conductive layer 506 is then formed in the openings in a plating process, by using the initial conductive layer 502 as an electrode (e.g., a cathode). After that, the mask for plating is removed.

Figure 5D:
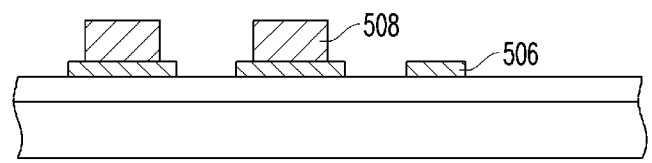

Then, referring to FIG. 5D, a set of electrically conductive posts 508 are formed adjacent to the patterned conductive layer 506 by a semi-additive process. Specifically, a dielectric material, a photo-resist, or another applicable material serving as a temporary mask is disposed adjacent to the structure of FIG. 5C. Then, the mask is patterned to form a set of openings at locations corresponding to the conductive posts 508. The conductive posts 508 are then formed in the openings in a plating process, by using the initial conductive layer 502 and the patterned conductive layer 506 as an electrode (e.g., a cathode). After that, the mask for plating is removed.

Figure 5E:
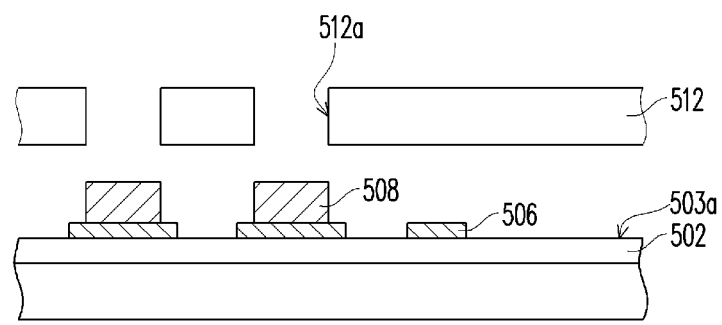
Figure 5F:
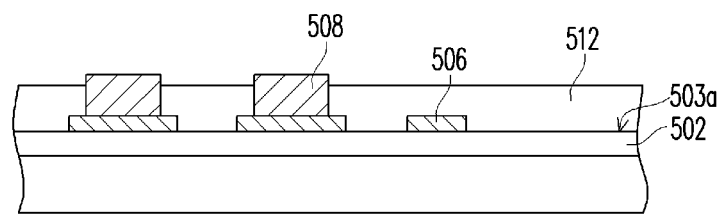

Then, referring to both FIG. 5E and FIG. 5F, a dielectric layer 512 is laminated over the first surface 503a of the initial conductive layer 502 and then compressed onto the first surface 503a of the initial conductive layer 502 by a thermal compressing process, wherein the conductive posts 508 respectively extend through a set of openings 512a pre-defined in the dielectric layer 512 and are exposed by the dielectric layer 512. The dielectric layer 512 can be, for example, a prepreg.

Figure 5G:
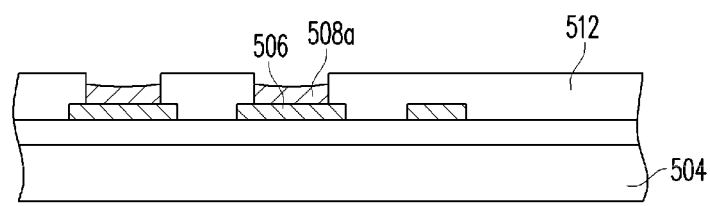

Next, referring to FIG. 5G, a portion of each of the conductive posts 508 is removed to form a set of truncated conductive posts 508a, wherein a sum of a height of one of the conductive posts 508a and a thickness of the patterned conductive layer 506 is less than a thickness of the dielectric layer 512. In the present embodiment, a portion of each of the conductive posts 508 can be removed by etching or another material removal technique, such that an end of each of the conductive posts 508a facing away from the patterned conductive layer 506 is concave or has another curved profile.

Figure 5H:
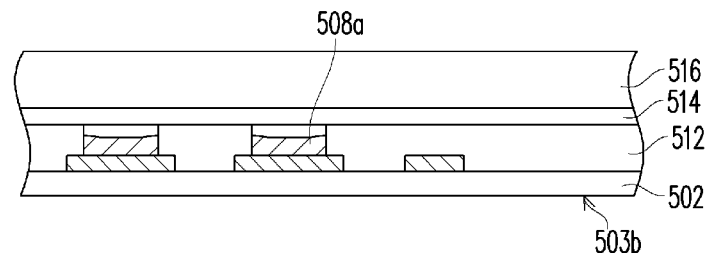

Next, referring to FIG. 5H, the first carrier 504 is removed to expose the second surface 503b of the initial conductive layer 502, and a second carrier 516 and a dry film layer 514 are disposed adjacent to the dielectric layer 512, wherein the dry film layer 514 is located between the second carrier 516 and the dielectric layer 512.

Figure 5I:
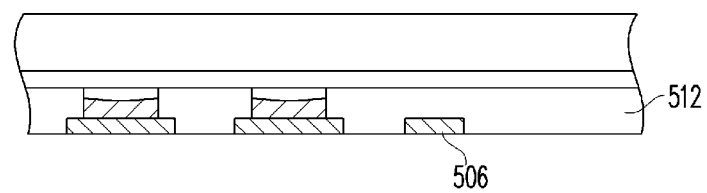

Then, referring to FIG. 5I, the initial conductive layer 502 is removed to expose the dielectric layer 512 and the patterned conductive layer 506. The initial conductive layer 502 can be removed by etching or another material removal technique.

Figure 5J:
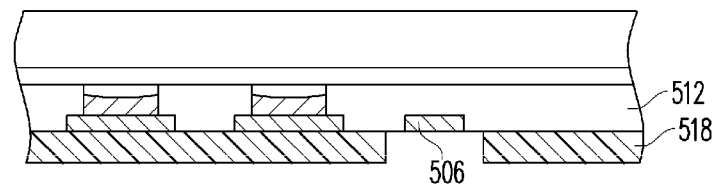

Next, referring to FIG. 5J, a patterned solder resist layer 518 is formed adjacent to the dielectric layer 512, wherein the patterned solder resist layer 518 exposes a portion of the patterned conductive layer 506.

Figure 5K:
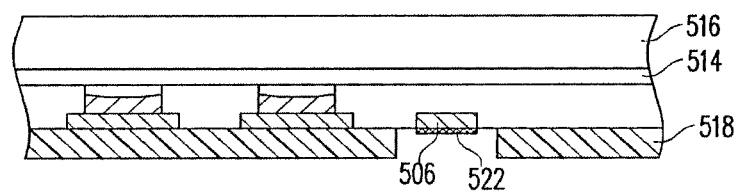

Afterwards, referring to FIG. 5K, a surface passivation layer 522 is formed adjacent to and covers the portion of the patterned conductive layer 506 exposed by the patterned solder resist layer 518. It is noted that the surface passivation layer 522 can reduce the oxidation rate of the patterned conductive layer 506 and can enhance bonding between the patterned conductive layer 506 and conductive wires (not shown), when the patterned conductive layer 506 serves as bonding pads for a wire-bonding technique.

Figure 5L:
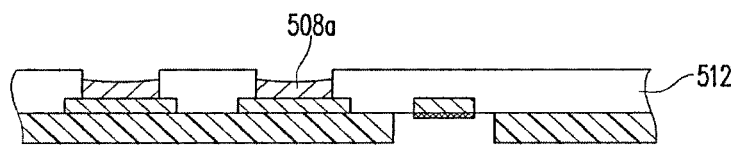

Then, referring to FIG. 5L, the second carrier 516 and the dry film layer 514 are removed to expose the dielectric layer 512 and the conductive posts 508a.

Figure 5M:
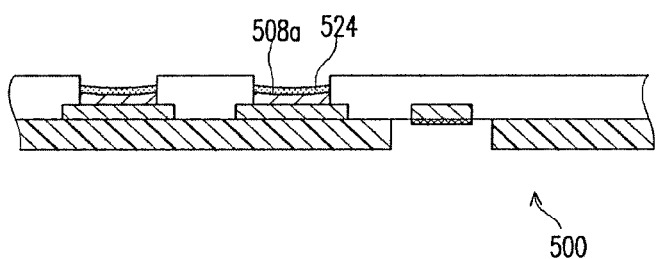

After that, referring to FIG. 5M, a surface passivation layer 524 is formed adjacent to the conductive posts 508a, wherein the surface passivation layer 524 can be an anti-oxidation layer, such as an OSP to reduce the oxidation rate of the conductive posts 508a. In such manner, the package carrier 500 is formed.

The present embodiment forms the conductive posts 508 that are connected to the patterned conductive layer 506, compresses the dielectric layer 512 onto the patterned conductive layer 506 while exposing a portion of each of the conductive posts 508, thereby obtaining the package carrier 500 including an embedded circuit and the conductive posts 508a.

Once the package carrier 500 is fabricated, a package according to an embodiment of the invention can be fabricated by disposing a chip (e.g., the chip 104 in FIG. 1A) adjacent to the package carrier 500, electrically connecting the chip to the patterned conductive layer 506, and disposing solder balls (e.g., the solder balls 102 of FIG. 1A) adjacent to the conductive posts 508a. By forming connections to the patterned conductive layer 506 (i.e., the embedded circuit) through the conductive posts 508a, the resulting package has the advantages of reduced package size while coping with a particular circuit layout (e.g., the layout of the patterned conductive layer 506), and controlling the cost and complexity of packaging processes.

Figure 6A:
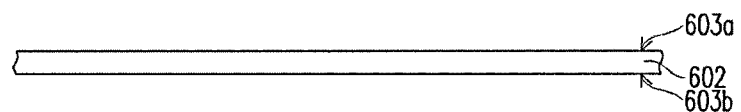
FIG. 6A to FIG. 6M illustrate a process of fabricating a package carrier according to another embodiment of the present invention.

FIG. 6A to FIG. 6M illustrate a process of fabricating the package carrier 600 according to an embodiment of the present invention. Referring to FIG. 6A, in the present embodiment, an initial electrically conductive layer 602 including a first surface 603a and a second surface 603b faced away from the first surface 603a is provided. The initial conductive layer 602 can be a copper foil, or can be formed of another metal, a metal alloy, or other suitable electrically conductive material.

Figure 6B:
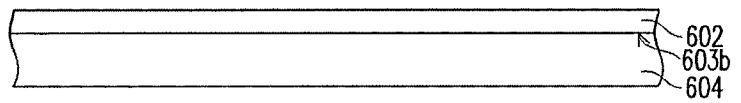

Next, referring to FIG. 6B, a first carrier 604 is disposed adjacent to the second surface 603b of the initial conductive layer 602.

Figure 6C:
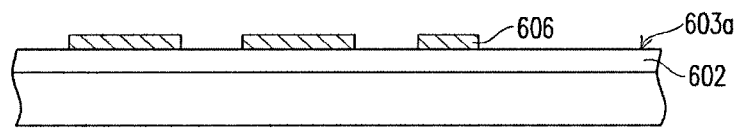

Next, referring to FIG. 6C, a patterned electrically conductive layer 606 is formed adjacent to the first surface 603a of the initial conductive layer 602 by a semi-additive process, similar to that discussed above for FIG. 5C.

Figure 6D:
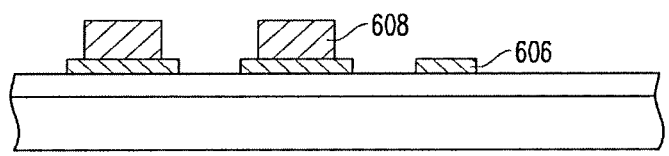

Then, referring to FIG. 6D, a set of electrically conductive posts 608 are formed adjacent to the patterned conductive layer 606 by a semi-additive process, similar to that discussed above for FIG. 5D.

Figure 6E:
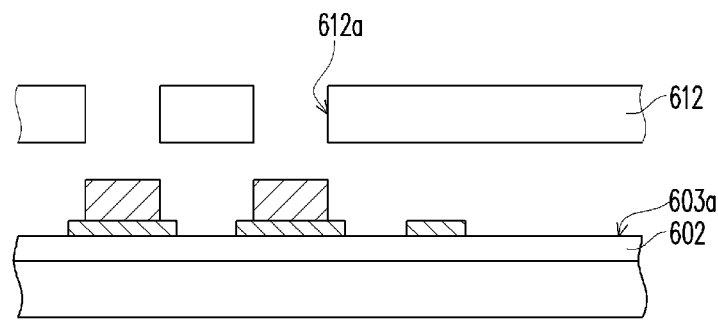
Figure 6F:
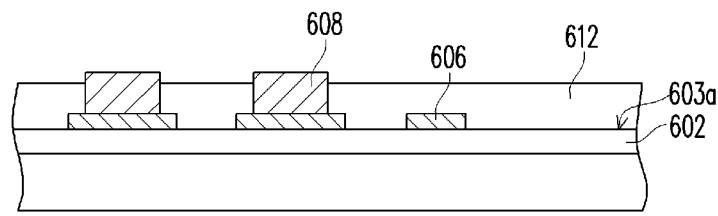

Then, referring to both FIG. 6E and FIG. 6F, a dielectric layer 612 is laminated over the first surface 603a of the initial conductive layer 602 and then compressed onto the first surface 603a of the initial conductive layer 602 by a thermal compressing process, wherein the conductive posts 608 respectively extend through a set of openings 612a pre-defined in the dielectric layer 612 and are exposed by the dielectric layer 612. The dielectric layer 612 can be, for example, a prepreg.

Figure 6G:
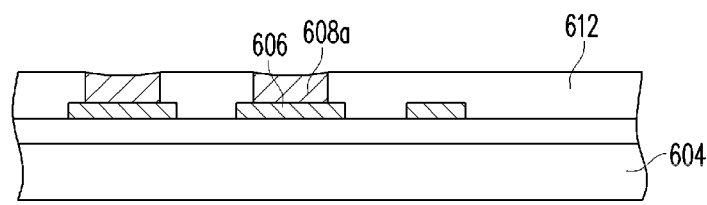

Next, referring to FIG. 6G, a portion of each of the conductive posts 608 is removed to form a set of truncated conductive posts 608a, wherein a sum of a height of one of the conductive posts 608a and a thickness of the patterned conductive layer 606 is substantially equal to a thickness of the dielectric layer 612. In the present embodiment, a portion of each of the conductive posts 608 can be removed by etching or another material removal technique, such that an end of each of the conductive posts 608a facing away from the patterned conductive layer 606 is concave or has another curved profile.

Figure 6H:
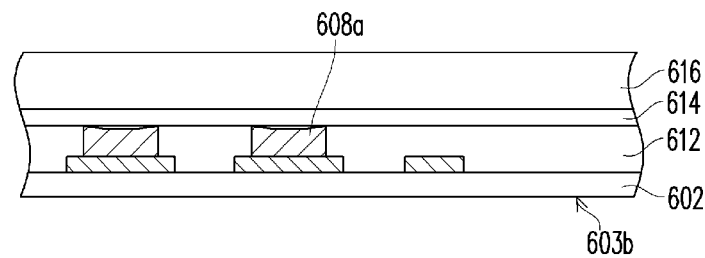

Next, referring to FIG. 6H, the first carrier 604 is removed to expose the second surface 603b of the initial conductive layer 602, and a second carrier 616 and a dry film layer 614 are disposed adjacent to the dielectric layer 612, wherein the dry film layer 614 is located between the second carrier 616 and the dielectric layer 612.

Figure 6I:
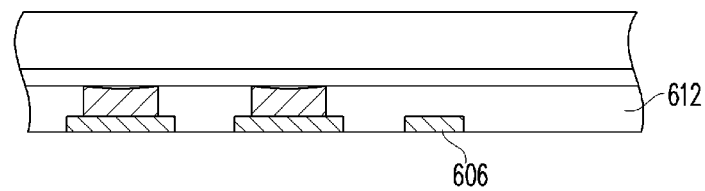

Then, referring to FIG. 6I, the initial conductive layer 602 is removed to expose the dielectric layer 612 and the patterned conductive layer 606. The initial conductive layer 602 can be removed by etching or another material removal technique.

Figure 6J:
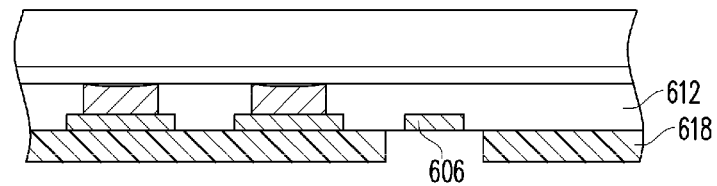

Next, referring to FIG. 6J, a patterned solder resist layer 618 is formed adjacent to the dielectric layer 612, wherein the patterned solder resist layer 618 exposes a portion of the patterned conductive layer 606.

Figure 6K:
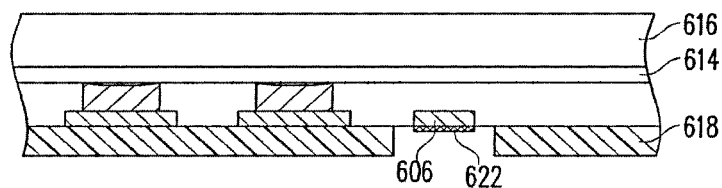

Afterwards, referring to FIG. 6K, a surface passivation layer 622 is formed adjacent to and covers the portion of the patterned conductive layer 606 exposed by the patterned solder resist layer 618. It is noted that the surface passivation layer 622 can reduce the oxidation rate of the patterned conductive layer 606 and can enhance bonding between the patterned conductive layer 606 and conductive wires (not shown), when the patterned conductive layer 606 serves as bonding pads for a wire-bonding technique.

Figure 6L:
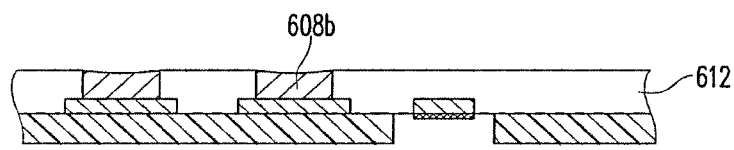

Then, referring to FIG. 6L, the second carrier 616 and the dry film layer 614 are removed to expose the dielectric layer 612 and the conductive posts 608a.

Figure 6M:
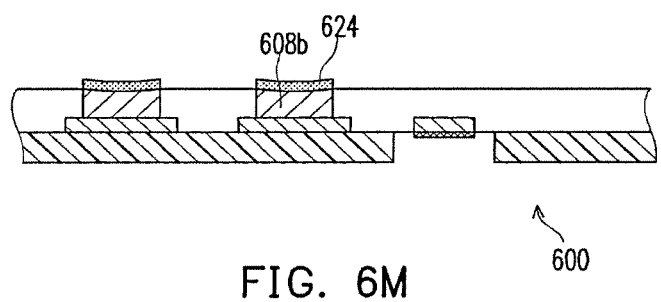

After that, referring to FIG. 6M, a surface passivation layer 624 is formed adjacent to the conductive posts 608a, wherein the surface passivation layer 624 can be an anti-oxidation layer, such as an OSP to reduce the oxidation rate of the conductive posts 608a. In such manner, the package carrier 600 is formed.

Once the package carrier 600 is fabricated, a package according to an embodiment of the invention can be fabricated by disposing a chip (e.g., the chip 104 in FIG. 1C) adjacent to the package carrier 600, electrically connecting the chip to the patterned conductive layer 606, and disposing solder balls (e.g., the solder balls 102 of FIG. 1C) adjacent to the conductive posts 608a.

It should be recognized that similar operations as discussed for FIG. 3A to FIG. 3R, FIG. 4A to FIG. 4Q, FIG. 5A to FIG. 5M, and FIG. 6A to FIG. 6M can be used to fabricate other package carriers and packages (e.g., as illustrated in FIG. 1B, FIG. 1D to FIG. 1H, FIG. 2B, and FIG. 2D).

In summary, in a package carrier of some embodiments of the invention, electrically conductive posts can be used so as to effectively reduce a package size and a package area, while controlling the cost and complexity of packaging processes.

While the invention has been described with reference to the specific embodiments thereof, it should be understood by those skilled in the art that various changes may be made and equivalents may be substituted without departing from the true spirit and scope of the invention. In addition, modifications may be made to adapt a particular situation, material, composition of matter, method, or process, within the scope of the claims, including variances or tolerances attributable to manufacturing processes and techniques. In particular, while the methods disclosed herein have been described with reference to particular operations performed in a particular order, it will be understood that these operations may be combined, sub-divided, or re-ordered to form an equivalent method and resultant structure consistent with the teachings of the invention.

What is claimed is:

1. A semiconductor package, comprising:
    a substrate, including:
        a dielectric layer having a plurality of openings;
        a conductive layer disposed adjacent to the dielectric layer;
        a plurality of conductive vias disposed in respective ones of the openings; and
        an etching stop layer disposed in the openings and physically contacting a top end of each of the plurality of conductive vias;
        wherein the conductive layer and the conductive vias are formed of the same material;
    a chip attached to a top side of the substrate and connected to the conductive layer; and
    a plurality of conductive bumps disposed adjacent to respective ones of the conductive vias,
    wherein the etching stop layer is physically contacting the conductive layer at a bottom surface of the conductive layer, and a bottom end of each conductive via is connected to the respective conductive bump such that the bottom end of the conductive via does not protrude from the respective opening.

2. The semiconductor package of claim 1, wherein the openings extend from a bottom surface of the dielectric layer to the conductive layer.

3. The semiconductor package of claim 1, wherein an end of each conductive via has a curved profile.

4. The semiconductor package of claim 1, further comprising: a solder resist layer, disposed adjacent to a top surface of the conductive layer and exposing portions of the conductive layer.

5. The semiconductor package of claim 4, further comprising: an adhesive layer, disposed between the chip and the solder resist layer.

6. The semiconductor package of claim 4, wherein the solder resist layer has an opening disposed adjacent to the chip and exposing a portion of the conductive layer, and further comprising: an adhesive layer, disposed in the opening of the solder resist layer and disposed between the chip and the exposed portion of the conductive layer.

7. The semiconductor package of claim 1, wherein a height of each conductive via is substantially equal to a depth of the respective opening.

8. The semiconductor package of claim 1, wherein the bottom end of each conductive via is recessed from a bottom surface of the dielectric layer.

9. The semiconductor package of claim 1, wherein the conductive vias are configured to relieve mechanical stress to the package.

10. The semiconductor package of claim 1, wherein the conductive layer covers a top end of each opening.

11. The semiconductor package of claim 1, wherein the bottom end of each conductive via is concave.

12. A substrate, comprising:
- a dielectric layer having a plurality of openings with sidewalls extending between a first surface of the dielectric layer and a second surface of the dielectric layer;
- a conductive material disposed within the plurality of openings;
- a barrier layer disposed over the conductive material;
- a patterned conductive layer in physical contact with the dielectric layer and the barrier layer, and in electrical contact with the conductive material through the barrier layer, wherein the patterned conductive layer is formed of the same material as the conductive material; and
- a solder resist layer disposed on the patterned conductive layer and exposing portions of the patterned conductive layer to form a plurality of contact pads.

13. The substrate of claim 12, wherein a surface of the conductive material is recessed from the second surface of the dielectric layer.

14. The substrate of claim 13, further comprising a plurality of solder balls disposed within the plurality of openings and in electrical contact with the conductive material, the plurality of solder balls extending beyond the second surface of the dielectric layer and covering a portion of the second surface of the dielectric layer outside of the plurality of openings.

15. The substrate of claim 12, wherein at least a portion of a surface of the conductive material is aligned with the second surface of the dielectric layer.

16. The substrate of claim 15, further comprising a plurality of solder balls disposed in electrical contact with the conductive material, the plurality of solder balls covering a portion of the second surface of the dielectric layer outside of the plurality of openings.

17. The substrate of claim 12, further comprising an adhesive layer disposed over at least one of the plurality of contact pads.

18. The substrate of claim 12, wherein a height of the conductive material is substantially equal to a depth of the plurality of openings.

19. The substrate of claim 12, wherein the conductive layer covers an end of each opening.

20. The substrate of claim 12, wherein the conductive material is copper.

* * * * *